(12) United States Patent
Vishwanath et al.

(10) Patent No.: US 11,764,219 B2
(45) Date of Patent: Sep. 19, 2023

(54) METAL SPACE CENTERED STANDARD CELL ARCHITECTURE TO ENABLE HIGHER CELL DENSITY

(71) Applicant: Intel Corporation, Santa Clara, CA (US)

(72) Inventors: Harshitha Vishwanath, Bangalore (IN); Renukprasad Hiremath, Portland, OR (US); Sukru Yemenicioglu, Portland, OR (US); Ranjith Kumar, Beaverton, OR (US); Ruth Amy Brain, Portland, OR (US)

(73) Assignee: Intel Corporation, Santa Clara, CA (US)

(*) Notice: Subject to any disclaimer, the term of this patent is extended or adjusted under 35 U.S.C. 154(b) by 777 days.

(21) Appl. No.: 16/700,064

(22) Filed: Dec. 2, 2019

(65) Prior Publication Data

US 2021/0167066 A1 Jun. 3, 2021

(51) Int. Cl.
*H01L 27/092* (2006.01)
*H01L 23/522* (2006.01)
*H01L 23/528* (2006.01)
*H01L 27/02* (2006.01)

(52) U.S. Cl.
CPC ...... *H01L 27/0924* (2013.01); *H01L 23/5226* (2013.01); *H01L 23/5286* (2013.01); *H01L 27/0207* (2013.01)

(58) Field of Classification Search
CPC ............. H01L 27/0924; H01L 27/0207; H01L 23/5226; H01L 23/5286
USPC ........................................................ 257/369
See application file for complete search history.

(56) References Cited

U.S. PATENT DOCUMENTS

2019/0155984 A1* 5/2019 Chen .................... G06F 30/398
2020/0105670 A1* 4/2020 Zhu ..................... H01L 27/0924

* cited by examiner

*Primary Examiner* — Tu-Tu V Ho
(74) *Attorney, Agent, or Firm* — Schwabe, Williamson & Wyatt P.C.

(57) ABSTRACT

Embodiments disclosed herein include a semiconductor device. In an embodiment, the semiconductor device comprises a substrate, and a cell on the substrate. In an embodiment, the cell comprises a plurality of transistors over the substrate, and a first metal layer over the plurality of transistors. In an embodiment, the first metal layer comprises a first power line, wherein a width of the first power line is entirely within the cell, a second power line, wherein a width of the second power line is entirely within the cell, and a plurality of signal lines between the first power line and the second power line.

25 Claims, 16 Drawing Sheets

METAL SPACE CENTERED STANDARD CELL ARCHITECTURE TO ENABLE HIGHER CELL DENSITY

TECHNICAL FIELD

Embodiments of the present disclosure relate to semiconductor devices, and more particularly to interconnect architectures for transistor cells.

BACKGROUND

In semiconductor devices (e.g., processors, memory devices, etc.) functional blocks of transistors are grouped into cells. Design rules dictate the number rows of signal traces and power rails that can be used to address the transistors within a cell. Typically, the power rails are split between two cells and the signal traces are arranged between the power rails. Increasing the number of signal traces between the power rails increases the routing flexibility and can provide more efficient use of area on the die.

Since the power rails are shared by more than one cell, they need to be larger than the signal lines to accommodate the power requirements of both cells. For example, the shared power rails may have a width that is approximately 50 nm or larger and the signal lines may be approximately 30 nm or smaller. However, at smaller processing nodes (e.g., process nodes less than 10 nm) design rules dictate that the first metal layer (e.g., M0) must have uniform trace widths. As such, additional power rails are added within the cell at the expense of signal lines. This is particularly problematic for short height libraries (e.g., 7 diffusion grid (DG) libraries).

EMBODIMENTS OF THE PRESENT DISCLOSURE

Described herein are semiconductor devices with cells that have a space centered metal pattern (SCMP) architecture, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1A:
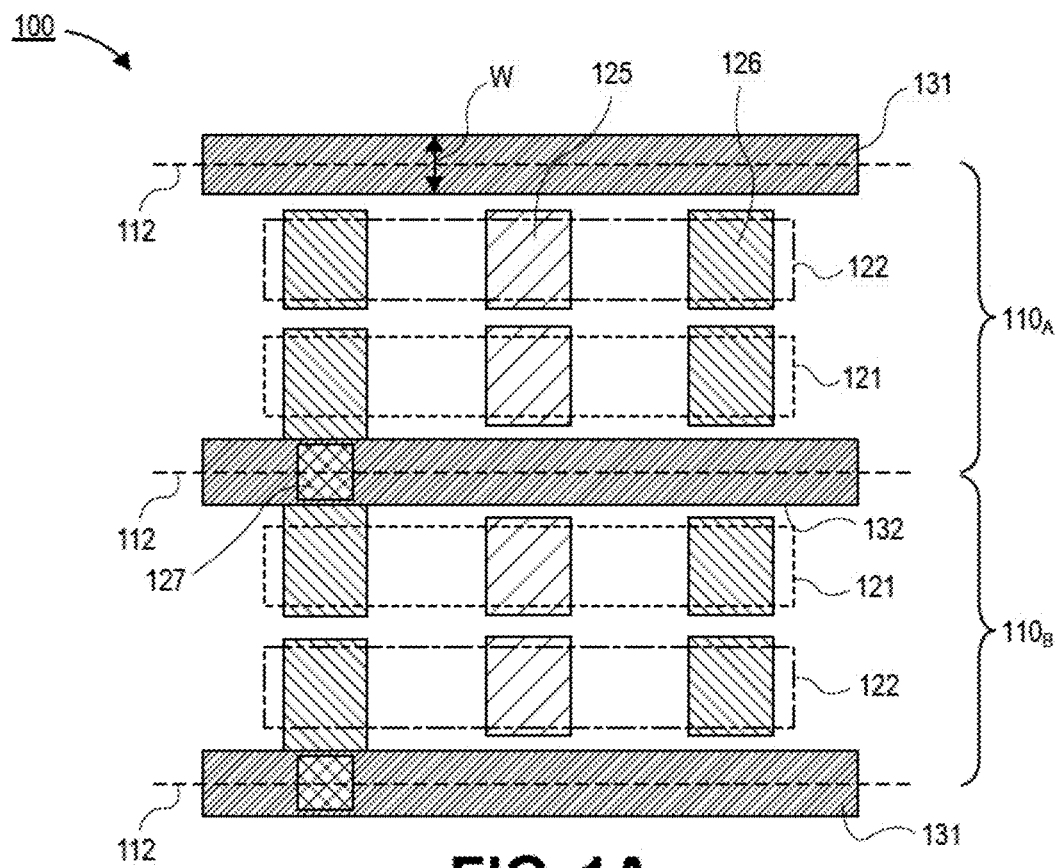
FIG. 1A is a plan view illustration of a semiconductor device with a pair of cells.

As noted above, semiconductor devices (e.g., processors, memory devices, etc.) include functional blocks of transistors that are grouped into cells. For example, as shown in FIG. 1A, each of the cells 110 may include an n-type region 121 and a p-type region 122. Each region may include one or more p-type or n-type transistors, respectively. In FIG. 1A the source/drain (S/D) contacts 126 and the gate contacts 125 are shown. Design rules dictate the number rows of signal traces (not shown in FIG. 1A) and power rails 131, 132 that can be used to address the transistors within a cell 110 (i.e., by dropping a via 127 from the signal trace or power rail to the contact 125 or 126 below).

The power rails are split between two cells and the signal traces are arranged between the power rails. For example, in FIG. 1A, a pair of adjacent cells $110_A$ and $110_B$ in a semiconductor device 100 are shown. Each of the power rails 131 and 132 (e.g., VCC and VSS) are centered over a boundary 112 between cells $110_A$ and $110_B$. As shown, the power rails 131 are shared with neighboring cells (not shown) that are above and below the two cells $110_A$ and $110_B$, respectively. The power rail 132 is shared between cell $110_A$ and cell $110_B$.

Figure 1B:
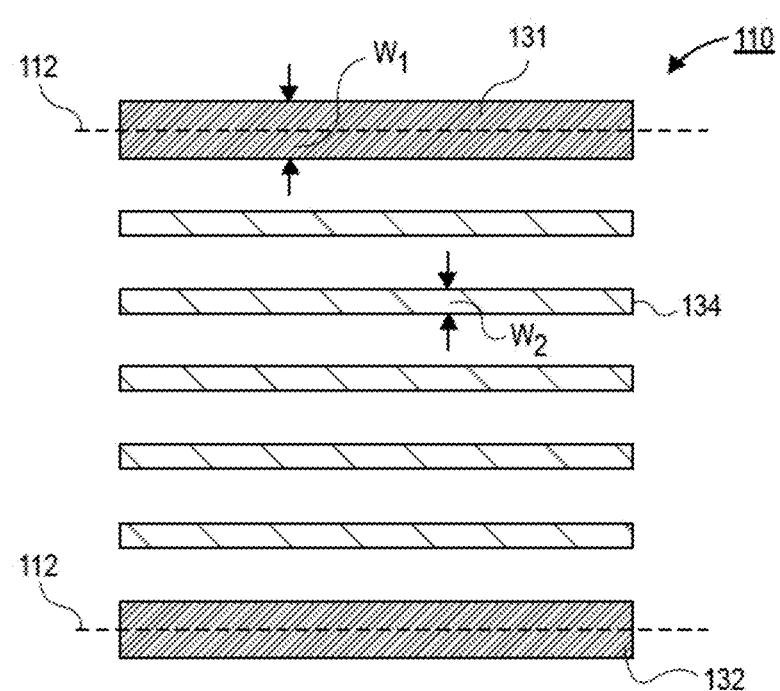
FIG. 1B is a plan view illustration of the power rails and signal lines in an 8DG cell with variable trace widths.

Referring now to FIG. 1B, a plan view illustration of the first metal layer (i.e., M0) of a cell 110 is shown. FIG. 1B further illustrates the plurality of signal lines 134 within the cell 110. As shown, the power rails 131 and 132 may have a first width $W_1$ that is greater than the second width $W_2$ of the signal lines 134. Such a configuration is suitable for larger process nodes that allow variable trace widths.

Figure 1C:
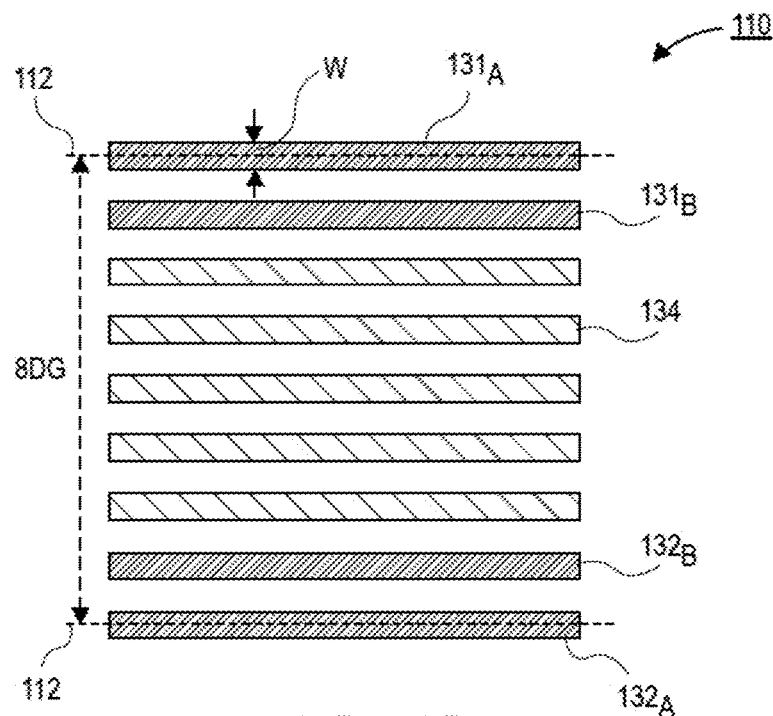
FIG. 1C is a plan view illustration of the power rails and signal lines in an 8DG cell with uniform trace widths.

At smaller process nodes (e.g., process nodes less than 10 nm) variable trace width is more difficult to implement. As such, the width W of the power rails $131_A$ and $132_A$ needs to be reduced to match the width of the signal lines 134. FIG. 1C illustrates an example of the M0 layer for such process nodes. The smaller power rails $131_A$ and $132_A$ are not suitable for accommodating two cells each. As such, additional power rails $131_B$ and $132_B$ are provided within the cell 110. Moving to a smaller process node also allows for the minimum width W and pitch of the traces to be reduced compared to that shown in FIG. 1B. Reducing the pitch and width of the traces allows for the same number of signal lines 134 to be maintained within the 8DG cell height.

The 8DG cell in FIG. 1C is referred to as a medium height library. However, semiconductor devices often also need different sized cells tailored for different purposes. For example, short height libraries for high density applications, medium height libraries for a mixture of high density and performance applications, and tall height libraries for performance applications may all be used for a given process node. Short height libraries can be used for low gate density applications and typically have a height of 7DG.

Figure 1D:
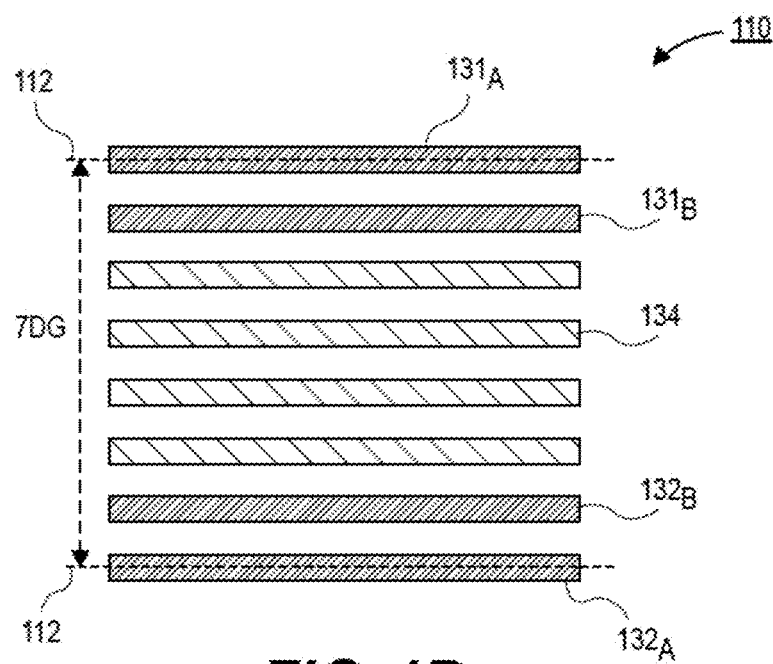
FIG. 1D is a plan view illustration of the power rails and signal lines in a 7DG cell with uniform trace widths.

An example of a 7DG cell 110 is shown in FIG. 1D. As shown, the reduction in height requires the removal of one of the signal lines 134. Particularly, the 7DG cell 110 includes four signal lines 134 compared to the five signal lines 134 in the 8DG cell 110 in FIG. 1C. This reduction in the number of signal lines 134 reduces the routing flexibility and efficiency of such libraries. The added signal routing complexity increases capacitance of the cell, increases the need for poly jumpers, and increases the usage of higher level interconnects. The limitation in the number of signal lines 134 also makes routing in single height impossible in some cells. Examples of the limitations of such 7DG cells are demonstrated in FIGS. 2A-4.

Figure 2A:
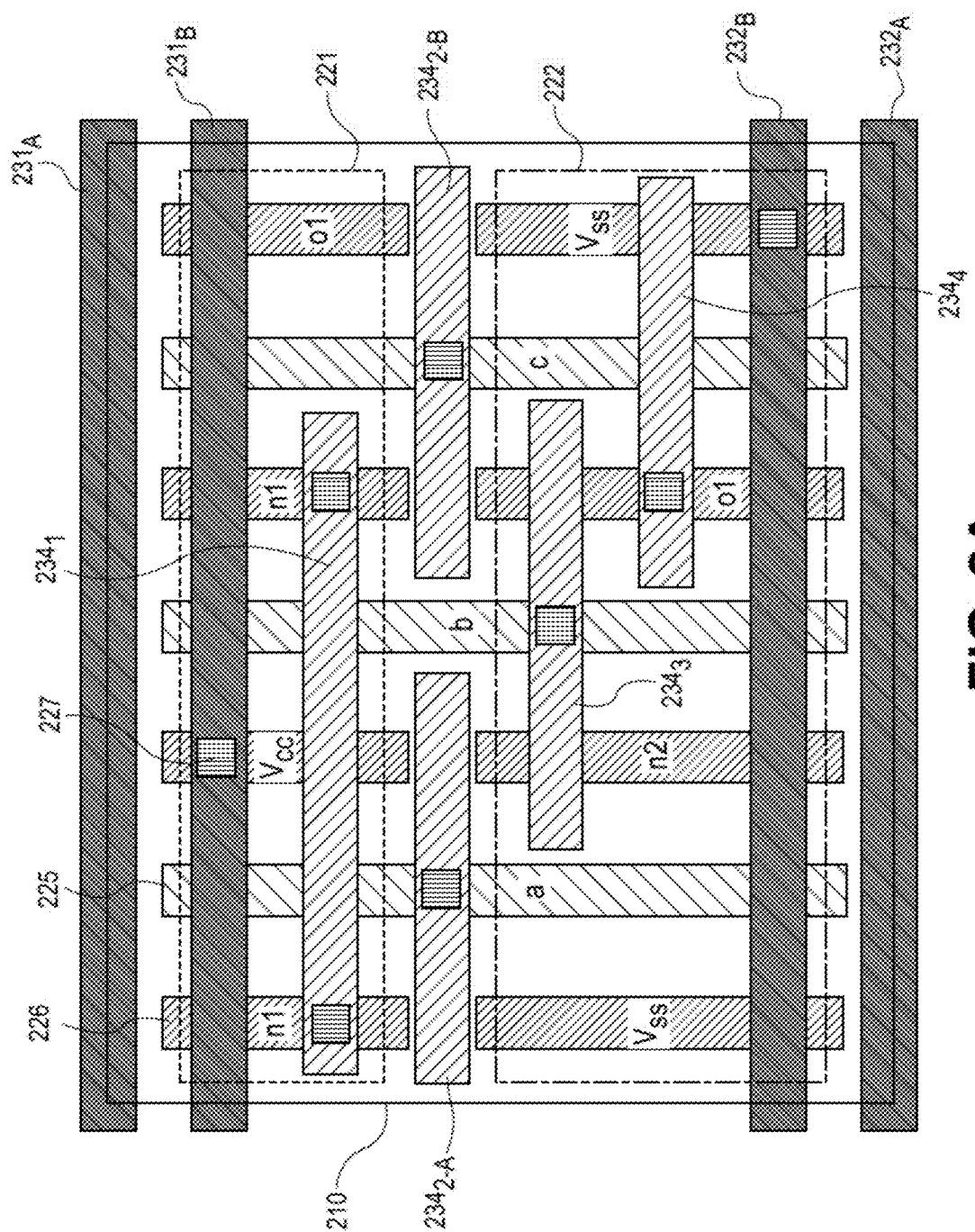
FIG. 2A is a plan view illustration of a combinatorial cell that is limited by a 7DG cell library.

Referring now to FIG. 2A, a plan view illustration of a combinatorial cell 210 that is limited by a 7DG cell size is shown. The cell 210 may comprise an n-type region 221 of transistors and a p-type region 222 of transistors. The S/D contacts 226 and the gate contacts 225 are shown. Additionally, the power rails $231_{A-B}$, $232_{A-B}$, and signal lines $234_{1-4}$ are shown. The power rails $231_B$, $232_B$ and signal lines $234_{1-4}$ are connected to different S/D contacts 226 and gate contacts 225 by vias 227.

A first signal line $234_1$ may couple together "n1" S/D contacts 226. A second signal line $234_{2-A}$ may contact the "a" gate contact 225, and a second signal line $234_{2-B}$ may contact the "c" gate contact 225. A third signal line 2343 may contact the "b" gate contact 225. A fourth signal line $234_4$ may contact the "o1" S/D contact 226 in the p-type region 222. The power rail $231_B$ may contact the "VCC" S/D contact 226, and the power rail $232_B$ may contact the "VSS" S/D contacts 226. However, there are no remaining signal lines to provide a connection to the "o1" S/D contact 226 in the n-type region 221.

Figure 2B:
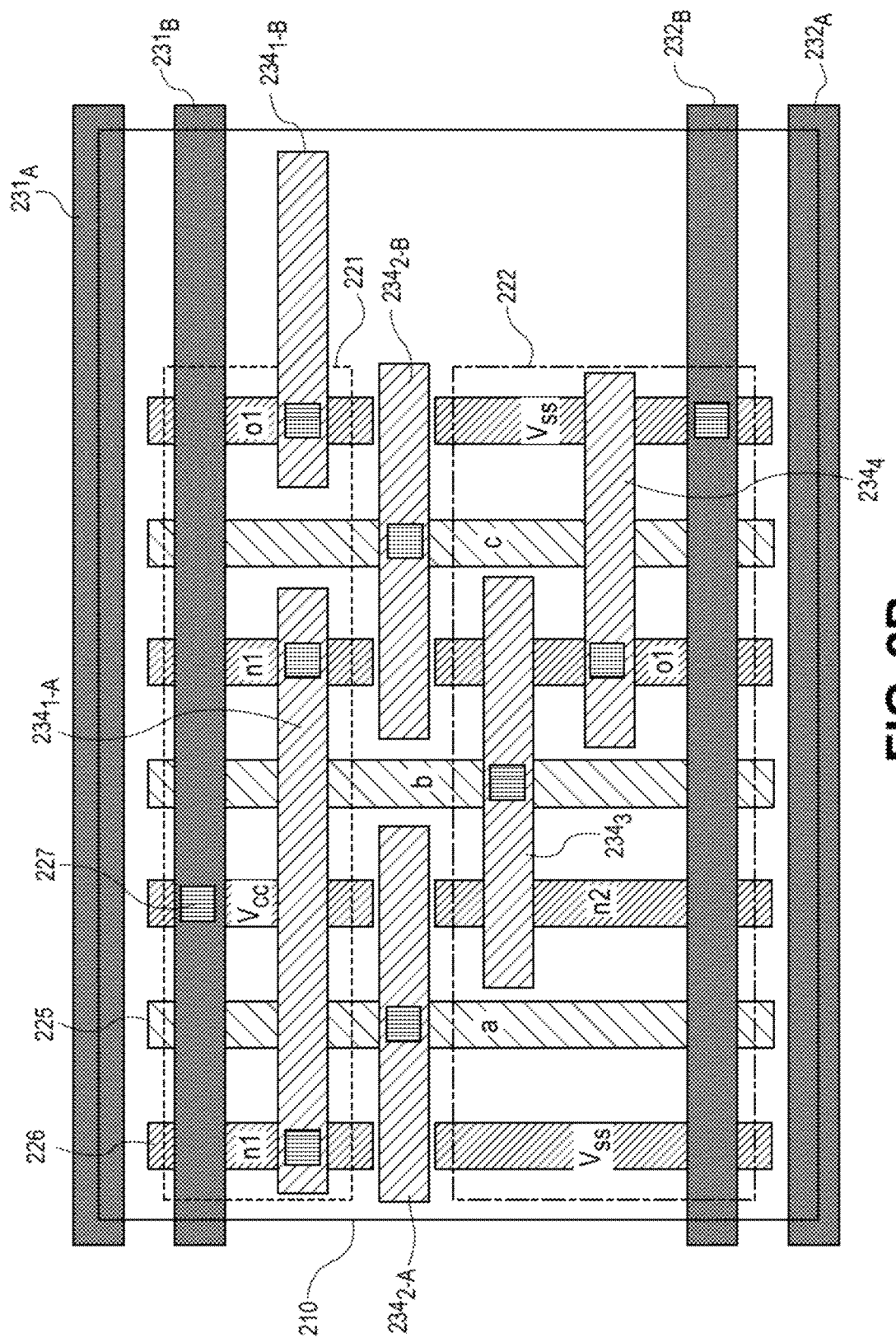
FIG. 2B is a plan view illustration of a combinatorial cell with an expanded footprint to accommodate a 7DG cell library.

Accordingly, the cell 210 needs to be modified to accommodate the limited number of signal traces 234, as shown in FIG. 2B. The cell 210 in FIG. 2B is substantially similar to the cell 210 in FIG. 2A, with the exception that the width of the cell 210 is increased to make space for an additional first signal line $234_{1-B}$. Since the first signal line $234_{1-A}$ occupies the space to the left of the "o1" S/D contact 226, the additional first signal line $234_{1-B}$ must extend out into space to the right of the "o1" S/D contact 226. For example, the cell 210 in FIG. 2A has a 4 poly pitch (PP) width, and the cell 210 in FIG. 2A has a 5 PP width.

Figure 3A:
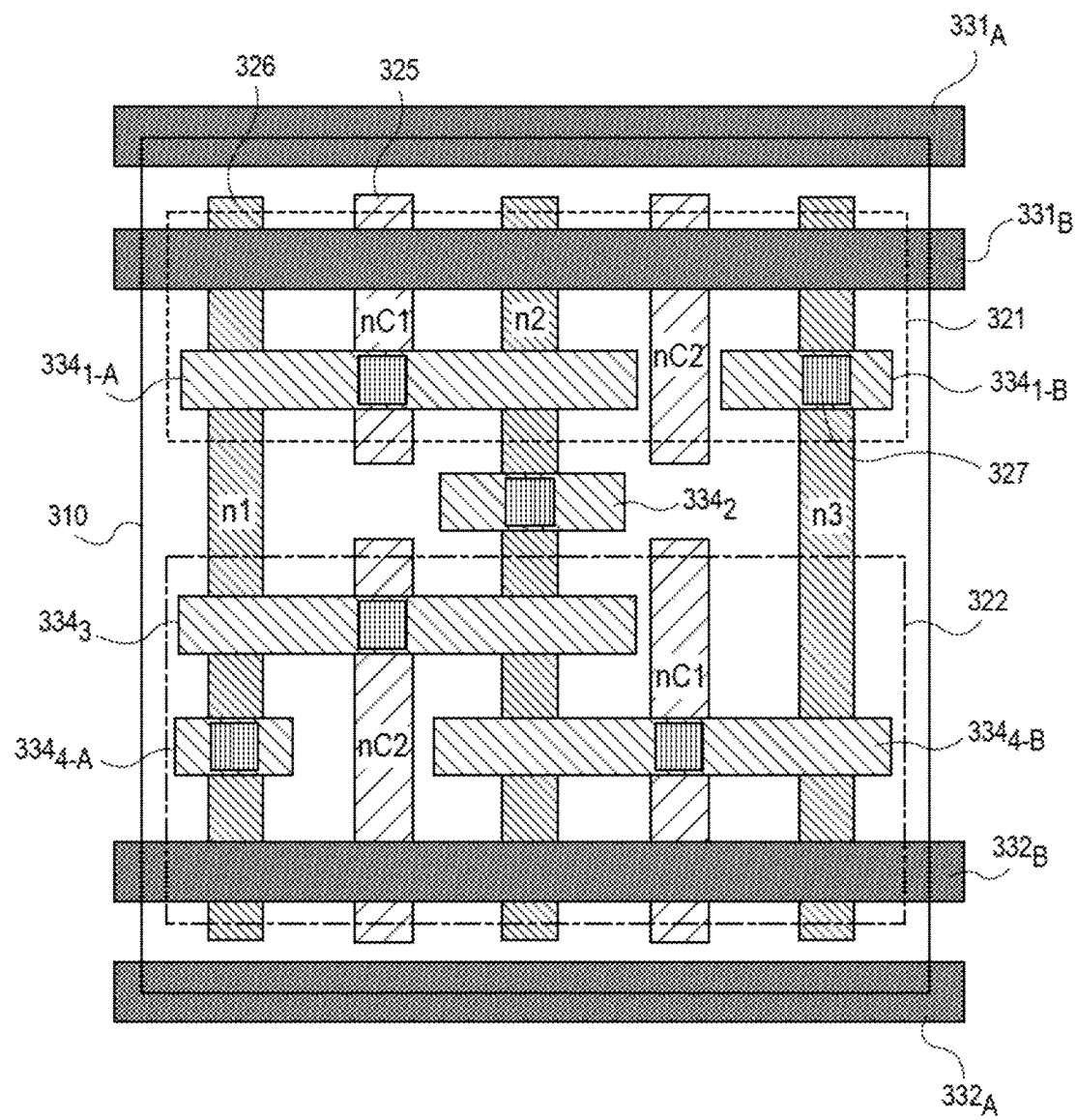
FIG. 3A is a plan view illustration of a transmission gate cell that is limited by a 7DG library.

Referring now to FIG. 3A, a plan view illustration of transmission gate cell 310 that is limited by the 7DG cell size is shown. The cell 310 may comprise an n-type region 321 of transistors and a p-type region 322 of transistors. The S/D contacts 326 and the gate contacts 325 are shown. Additionally, the power rails $331_{A-B}$, $332_{A-B}$, and signal lines $334_{1A-4B}$ are shown. The power rails $331_B$, $332_B$ and signal lines $334_{1A-4B}$ are connected to different S/D contacts 326 and gate contacts 325 by vias 327.

A first signal line $334_{1-A}$ may be connected to the "nC1" gate contact 325 in the n-type region 321, and an additional first signal line $334_{1-B}$ may be connected to the "n3" S/D contact 326. The second signal line $334_2$ may be connected to the "n2" S/D contact 326, and the third signal line $334_3$ may be connected to the "nC2" gate contact 325 in the p-type region 322. A fourth signal line $334_{4-A}$ may be connected to the "n1" S/D contact 326, and an additional fourth signal line $334_{4-B}$ may be connected to the "nC1" gate contact 325 in the p-type region 322. However, due to the limited routing flexibility there is no signal line that can be connected to the "nC2" gate contact 325 in the n-type region 321 within a 2 PP layout.

Figure 3B:
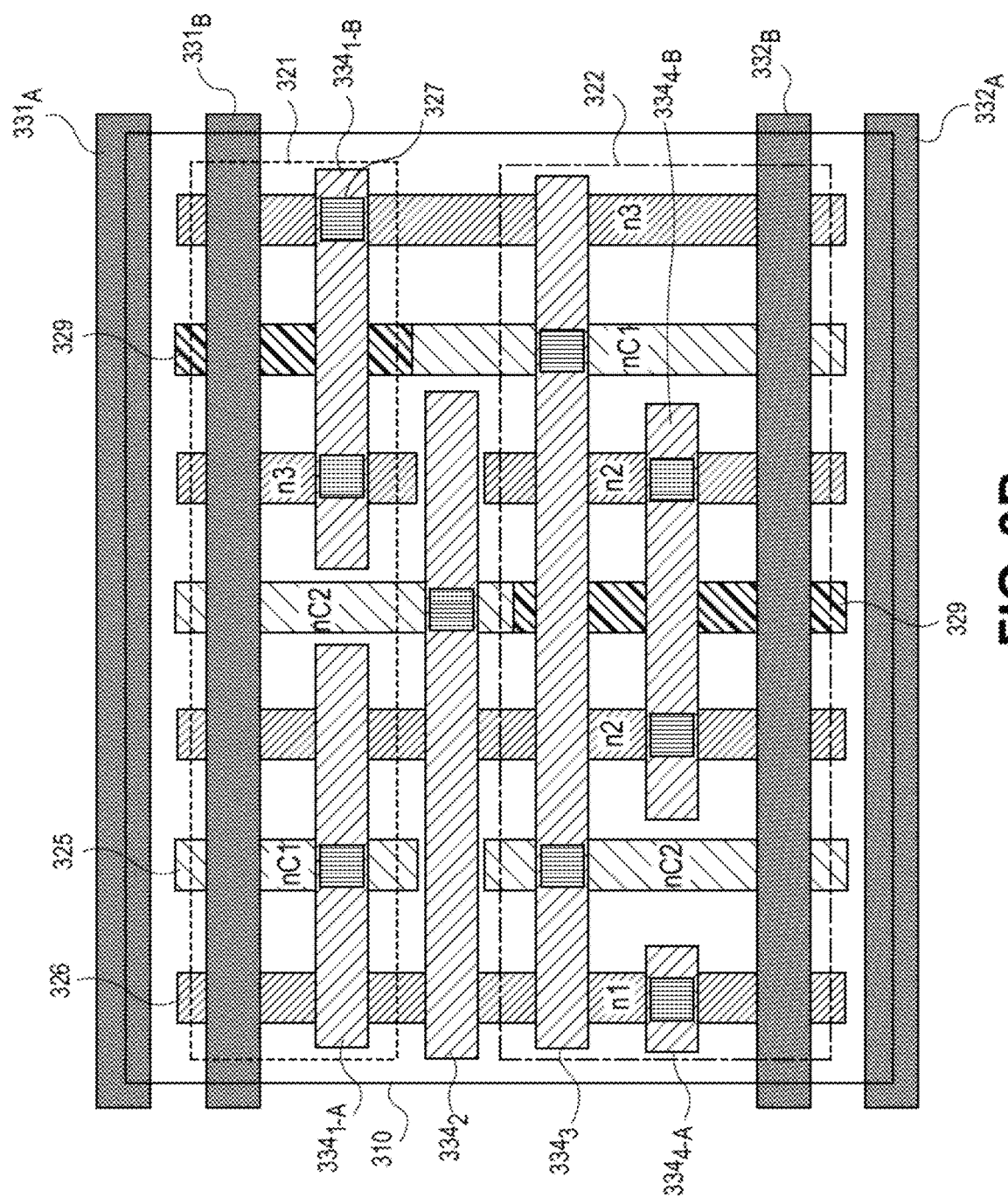
FIG. 3B is a plan view illustration of a transmission gate cell with an expanded footprint to accommodate a 7DG cell library.

Accordingly, the cell 310 needs to be modified to accommodate the limited number of signal traces 334, as shown in FIG. 3B. As shown in FIG. 3B, the cell 310 is increased to a 3 PP layout and dummy devices 329 are needed. The inclusion of dummy devices 329 increases the capacitance on the nets connected to the cell 310. As these nets are typically clock nets, such modifications affect clock performance.

In the modified cell 310, a first signal line $334_{1-A}$ may be connected to the "nC1" gate contact 325 in the n-type region 321, and an additional first signal line $334_{1-B}$ may be connected to the pair of "n3" S/D contacts 326. The second signal line $334_2$ is connected to the "nC2" gate contact 325 in the n-type region 321. A third signal line $334_3$ electrically couples together the "nC2" and "nC1" gate contacts in the p-type region 322. First fourth signal line $334_{4-A}$ contacts the "n1" S/D contact 326, and an additional fourth signal line $334_{4-B}$ couples together the "n2" S/D contacts 326 in the p-type region 322.

Figure 4:
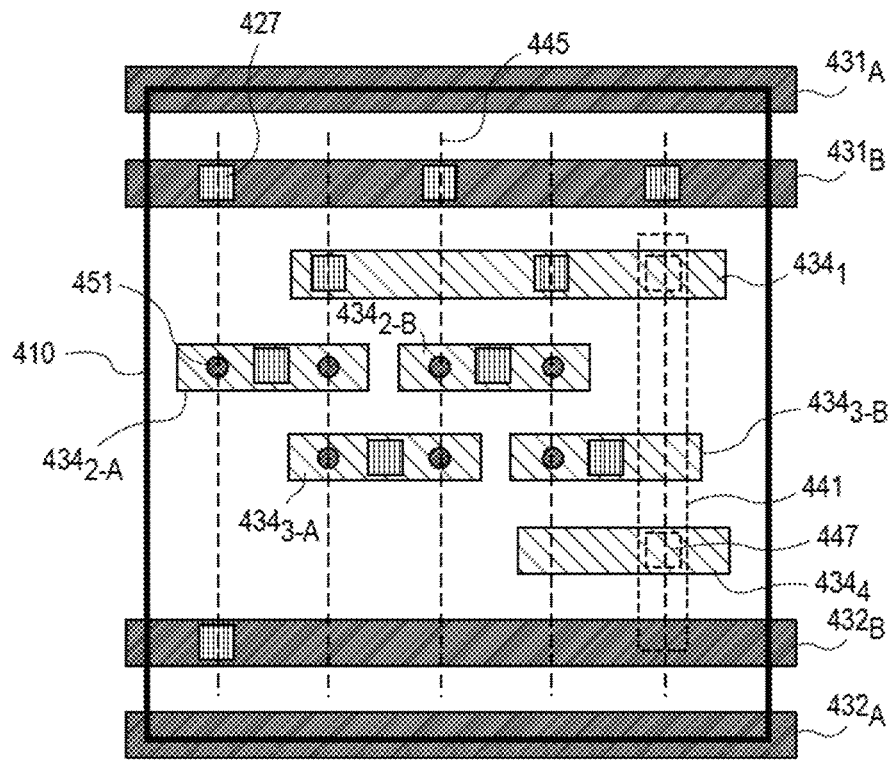
FIG. 4 is a plan view illustration of a four input NAND cell with hit-point issues due to the use of a 7DG cell library.

Referring now to FIG. 4, a plan view illustration of a four input NAND cell 410 that is limited by the 7DG cell size is shown. The cell 410 in FIG. 4 illustrates the power rails $431_{A-B}$, $432_{A-B}$, and the signal lines $434_{1-4}$. The dashed lines 445 indicate the metal tracks for the overlying metal layer (e.g., M1). Vias 427 provide connections from the illustrated metal layer (e.g., M0) to the underlying contacts (not shown in FIG. 4).

Particularly, the 7DG four input NAND cell 410 generates hit-point 451 issues. A hit-point 451 is a valid point where a via can be dropped to connect to upper metal lines (e.g., M1) without creating shorts or design rule (DR) violations. Valid layouts require at least two hit-points 451 for each input pin. For example, the inputs connected to signal lines $434_{2-A}$, $434_{2-B}$, and $434_{3-A}$ all include two hit-points 451. However, the input connected to signal line $434_{3-B}$ only allows for a single hit-point 451. This is because trace 441 occupies the area to the right of the signal line $434_{3-B}$. Trace 441 is shown with dashed lines to represent that trace 441 is above the M0 layer and connected to signal lines $434_1$ and $434_4$ by vias 447. Additionally, the signal line $434_{3-A}$ occupies the area to the left of the signal line $434_{3-B}$.

Accordingly, embodiments disclosed herein include cell layouts that shift the power rails off of the cell boundary. That is, a width of the power rails are entirely within the cell boundary. Since the power rails are not shared between neighboring cells, the smaller width is still suitable for handling the power delivery requirements of each cell. As such, the extra halves of the power rails needed in FIGS. 1C and 1D may be replaced with an additional signal line. This improves routing flexibility and enhances routing efficiency. Such layouts are also suitable for 7DG cell heights.

Figure 5:
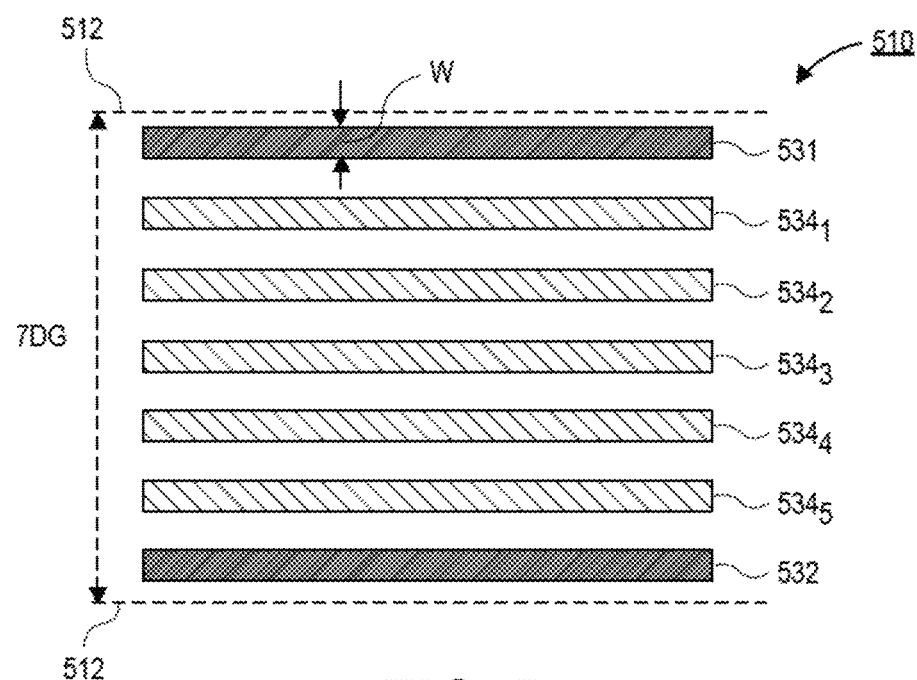
FIG. 5 is a plan view illustration of a 7DG cell with a space centered metal pattern (SCMP) in accordance with an embodiment.

An example of such a cell 510 is shown in the plan view illustration in FIG. 5. As shown, the power rails 531 and 532 have a width W that is entirely within the boundary of the cell 510. That is, the power rails 531 and 532 are within a boundary set by the top and bottom boundary lines 512. In an embodiment, the outer edges of the power rails 531 and 532 are spaced away from the boundary lines 512 by a half-pitch. Accordingly, when two cells are adjacent to each other, the power rail 531 or 532 in a first cell is spaced away from the neighboring power rail by a single pitch. In an embodiment, a plurality of signal lines $534_{1-5}$ are provided between the power rails 531 and 532. In the illustrated embodiment, five signal lines $534_{1-5}$ are provided in a 7DG layout. The width W of the power rails 531 and 532 may be substantially the same as the width of the signal lines $534_{1-5}$ to accommodate design rules for advanced process nodes (e.g., process nodes below 10 nm). In an embodiment, the width W may be approximately 20 nm or less.

Figure 6A:
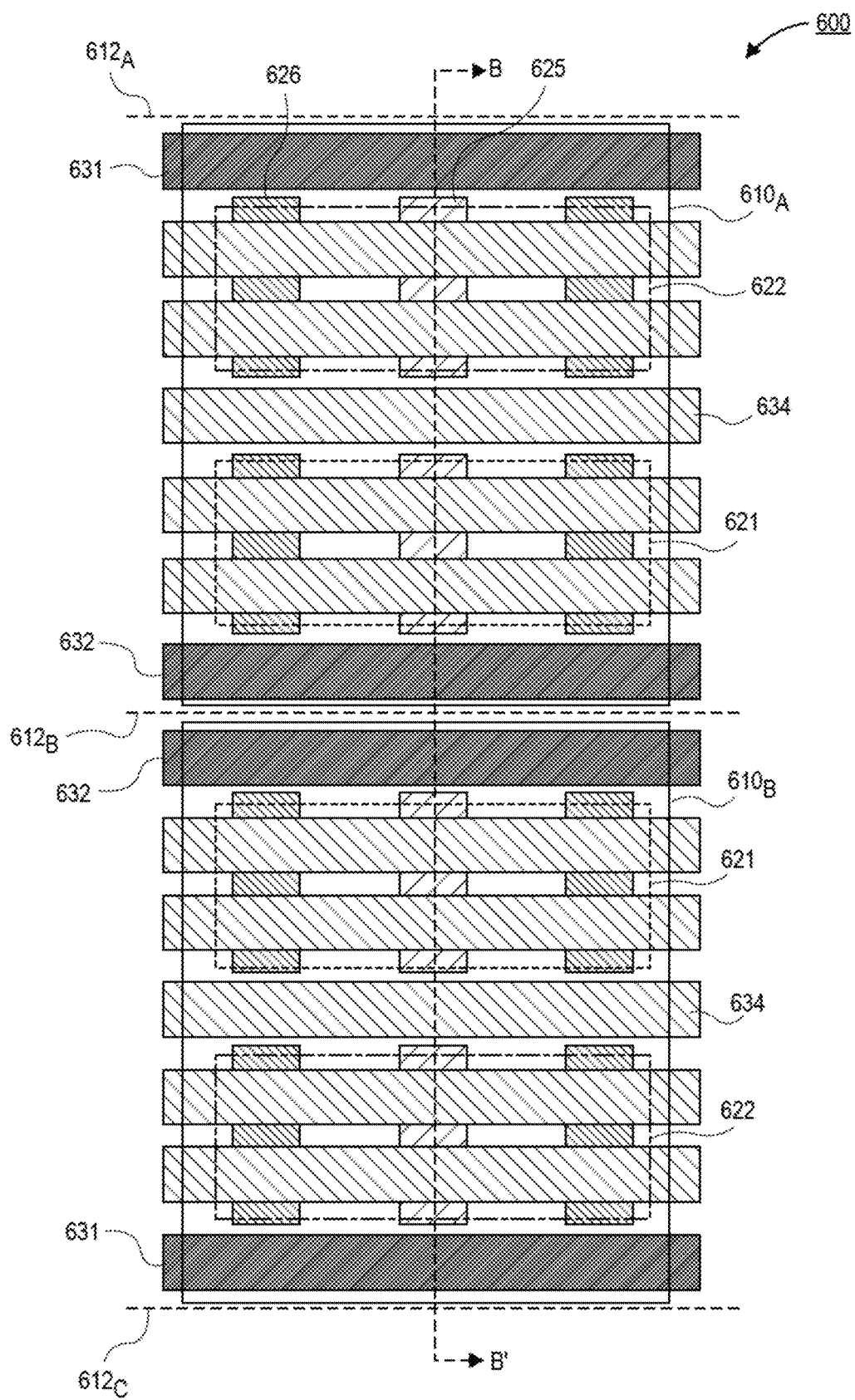
FIG. 6A is a plan view illustration of a semiconductor device with a pair of adjacent SCMP 7DG cells, in accordance with an embodiment.

Referring now to FIG. 6A, a plan view illustration of a pair of adjacent cells $610_A$ and $610_B$ in a semiconductor device 600 are shown, in accordance with an embodiment. In an embodiment, each cell 610 may comprise an n-type region 621 and a p-type region 622. Each region may comprise one or more n-type transistors or p-type transistors, respectively. In the illustrated embodiment, the S/D contacts 626 and the gate contacts 625 are shown.

As shown, the first cell $610_A$ is positioned between cell boundary lines $612_A$ and $612_B$, and the second cell $610_B$ is positioned between cell boundary lines $612_B$ and $612_C$. That is, the two cells $610_A$ and $610_B$ may share the cell boundary line $612_B$. In an embodiment, the first cell $610_A$ and the second cell $610_B$ may be mirror images of each other across cell boundary line $612_B$. For example, the n-type regions 621 and the power rails 632 may be adjacent to the boundary line $612_B$ for both cells $610_A$ and $610_B$. However, it is to be appreciated that embodiments are not limited to such configurations and different conductivity type regions may be on opposite sides of the boundary line $612_B$.

As noted above with respect to FIG. 5, the power rails 631 and 632 have widths that are entirely within the cells $610_A$ or $610_B$. Accordingly, embodiments may include configurations where there is no trace (e.g., power rail 631/632, signal line 634, etc.) directly over the cell boundary lines 612. Such a configuration may be referred to as a space centered metal pattern (SCMP) since the space between traces is centered over the cell boundary lines 612. This is different than the metal centered configurations described above, where a trace was always over the cell boundary lines 612.

In an embodiment, a plurality of signal lines 634 are positioned between the pairs of power rails 631 and 632 for each cell $610_A$ and $610_B$. In the illustrated embodiment, each cell 610 includes five signal lines 634. Due to the SCMP configuration, five signal lines 634 are still compatible with 7DG layouts. In an embodiment, two signal lines 634 are disposed over the n-type region 621, two signal lines 634 are disposed over the p-type region 622, and a single signal line 634 is disposed between the n-type region 621 and the p-type region 622. However, it is to be appreciated that embodiments are not limited to such configurations. For example, when the p-type region 622 and the n-type region 621 do not have the same area, there may be a different number of signal lines 634 over each region.

Figure 6B:
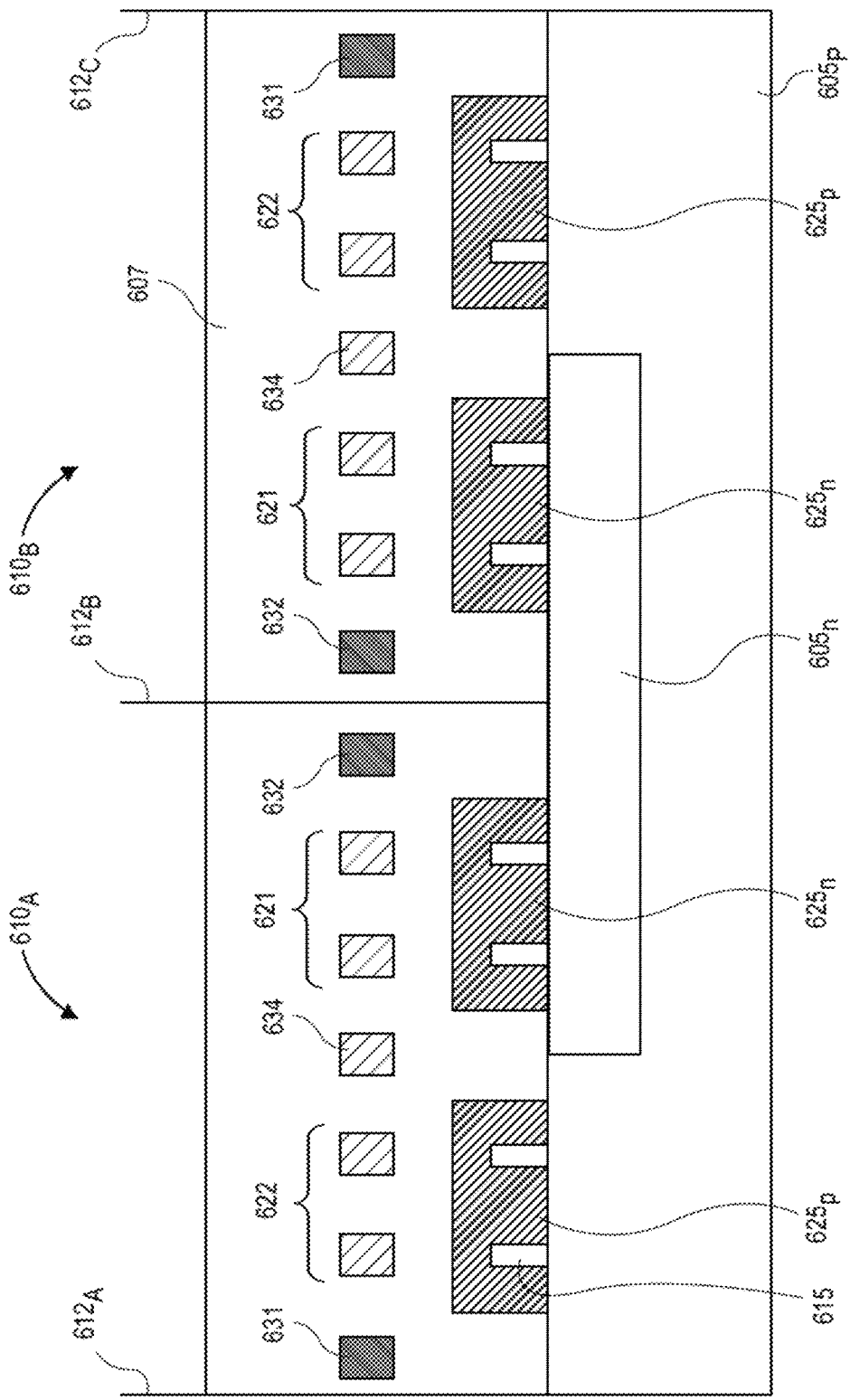
FIG. 6B is a cross-sectional illustration of the semiconductor device in FIG. 6A along line B-B', in accordance with an embodiment.

Referring now to FIG. 6B, a cross-sectional illustration of the semiconductor device 600 along line B-B' is shown, in accordance with an embodiment. The semiconductor device 600 may comprise a substrate 605. The substrate 605 may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. In an embodiment, an n-type substrate $605_n$ may be below the n-type regions 621, and a p-type substrate $605_p$ may be below the p-type region 622.

As shown, each of the gate contacts 625 may be disposed over one or more non-planar channels 615. For example, the channels 615 illustrated in FIG. 6B are tri-gate channels (e.g., fins). However, other embodiments may include channels 615 suitable for other transistor configurations, such as gate all around (GAA) transistors (e.g., nanowire devices). In an embodiment, a length direction of the channels 615 is substantially parallel to a length direction of the signal lines 634. For example, in FIG. 6A the length direction of the signal lines 634 and the length direction of the channels 615 are substantially perpendicular to the illustrated plane (i.e., into and out of the page).

The gate contacts $625_n$ are gate contacts for n-type transistors and the gate contacts $625_p$ are gate contacts for p-type transistors. In the illustrated embodiment, the channels 615 are shown in direct contact with gate contacts 625. Those skilled in the art will recognize that gate dielectrics may separate the channels 615 from the gate contacts 625. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. Further, the gate contacts 625 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example.

In an embodiment, an interlayer dielectric (ILD) 607 may be disposed over the substrate 605 and the gate contacts 625. The ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof.

The ILD 607 may surround the power rails 631, 632 and the signal lines 634. Particularly, the ILD 607 is the only material that crosses across the cell boundary line $612_B$. For example, the power rail 632 in the left cell is separated from the power rail 632 in the right cell by only the ILD 607 that passes across the cell boundary line $612_B$.

In an embodiment, as is also used throughout the present description, traces, such as power rails and signal lines, (and via material) are composed of one or more metal or other conductive structures. A common example is the use of copper lines and structures that may or may not include barrier layers between the copper and surrounding ILD material 607. As used herein, the term metal includes alloys, stacks, and other combinations of multiple metals. For example, the traces may include barrier layers (e.g., layers including one or more of Ta, TaN, Ti or TiN), stacks of different metals or alloys, etc. Thus, the traces may be a single material layer, or may be formed from several layers, including conductive liner layers and fill layers. Any suitable deposition process, such as electroplating, chemical vapor deposition or physical vapor deposition, may be used to form interconnect lines. In an embodiment, the traces are composed of a conductive material such as, but not limited to, Cu, Al, Ti, Zr, Hf, V, Ru, Co, Ni, Pd, Pt, W, Ag, Au or alloys thereof. The traces also sometimes referred to in the art as interconnect lines, wires, lines, metal, or simply interconnect.

Figure 7A:
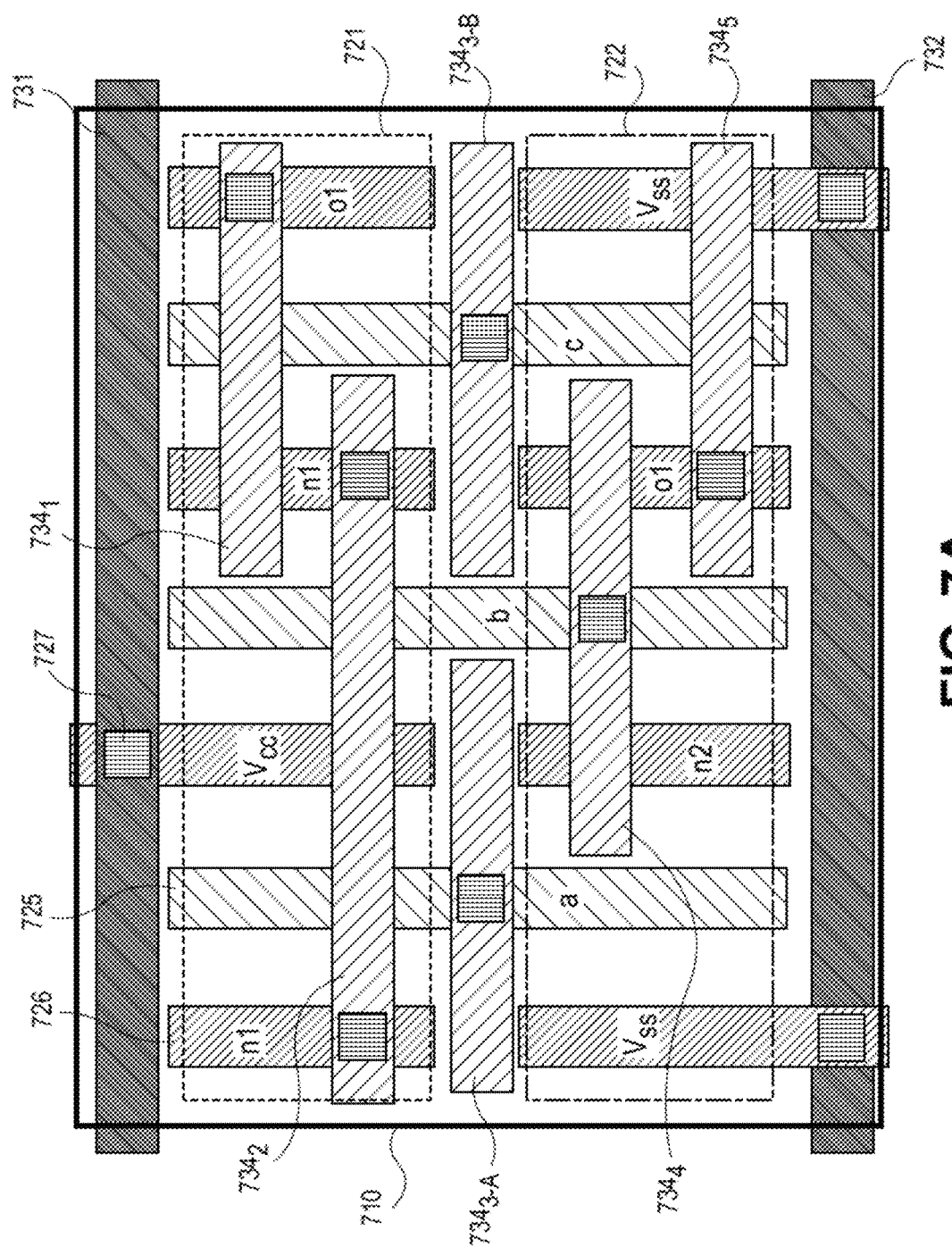
FIG. 7A is a plan view illustration of a combinatorial cell that is implemented with an SCMP 7DG cell, in accordance with an embodiment.
Figure 7B:
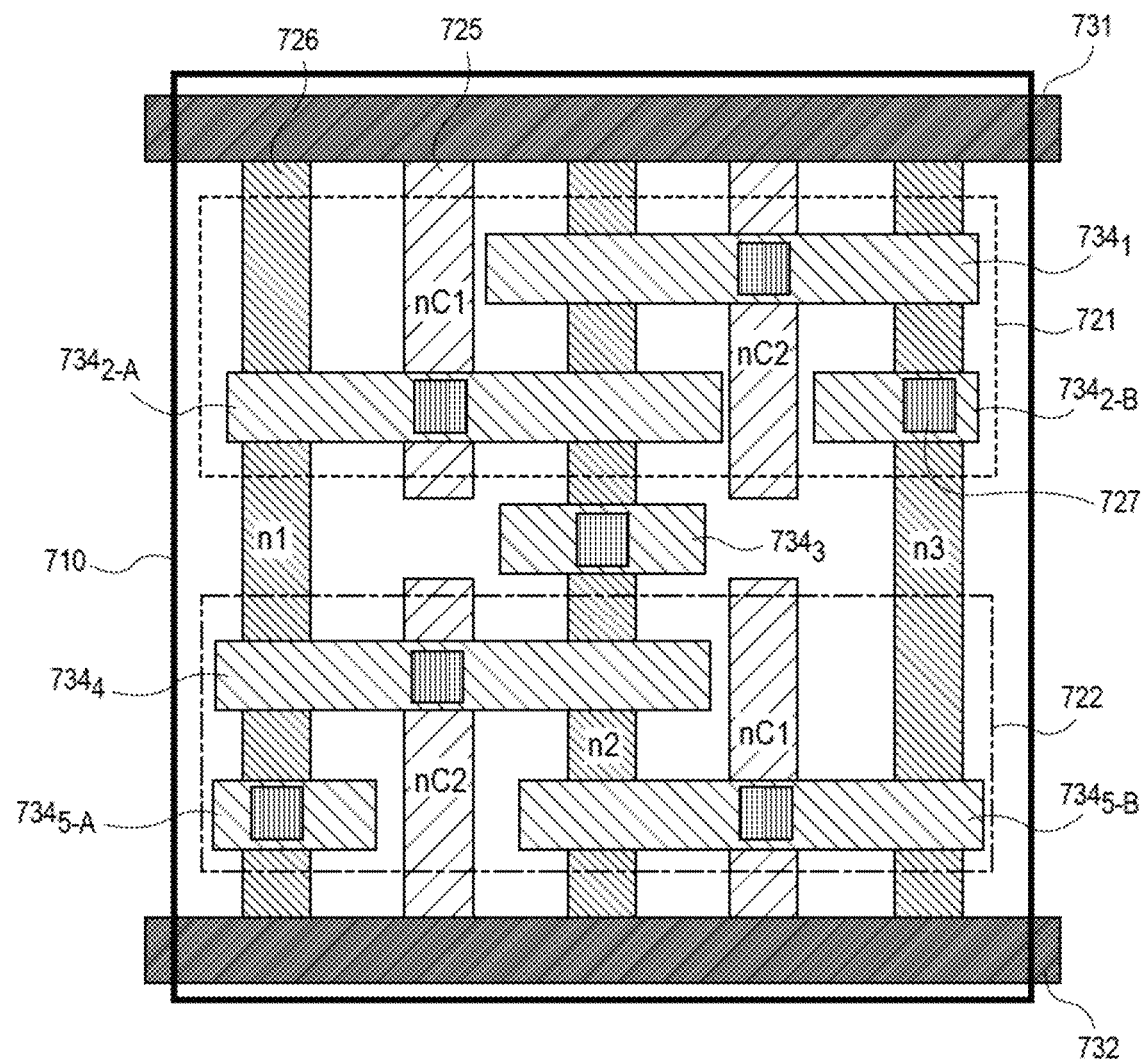
FIG. 7B is a plan view illustration of a transmission gate cell that is implemented with an SCMP 7DG cell, in accordance with an embodiment.
Figure 7C:
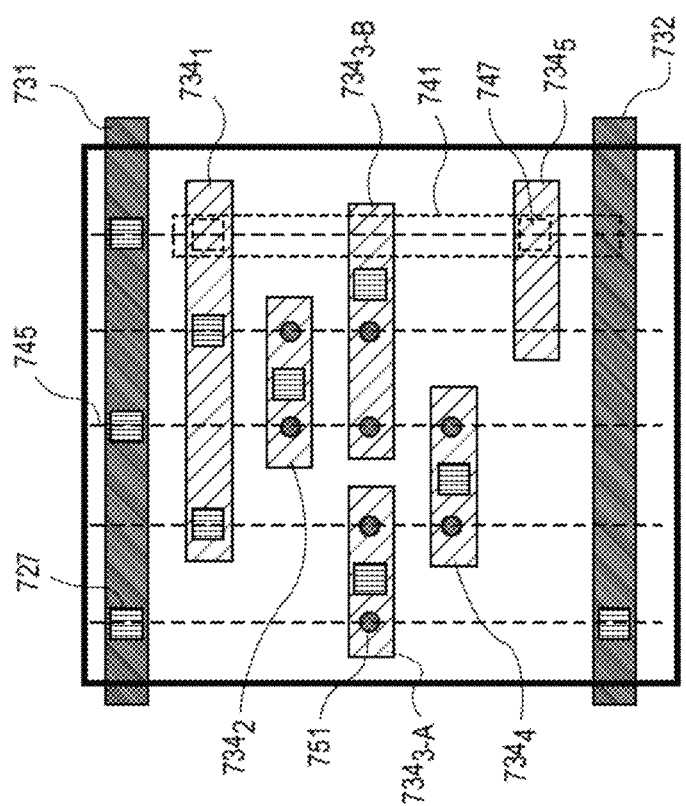
FIG. 7C is a plan view illustration of a four input NAND cell that is implemented with an SCMP 7DG cell, in accordance with an embodiment.

Referring now to FIGS. 7A-7C, a series of plan view illustrations of various cells 710 are shown, in accordance with various embodiments. The cells 710 in FIGS. 7A-7C illustrate how SCMP cells overcome the various design restriction inherent in cell layouts such as those described above in FIGS. 2A-4. For example, FIG. 7A illustrates a combinatorial cell with a SCMP 7DG cell, FIG. 7B illustrates a transmission gate cell with a SCMP 7DG cell, and FIG. 7C illustrates a four input NAND cell with SCMP 7DG cell.

Referring now to FIG. 7A, a plan view illustration of a combinatorial cell 710 with a SCMP 7DG layout is shown, in accordance with an embodiment. In an embodiment, the cell 710 comprises an n-type region 721 and a p-type region 722. In an embodiment, each S/D contact 726 is within either the n-type region 721 or the p-type region 722. In an embodiment, the gate contacts 725 may extend into both the p-type region 722 and the n-type region 721. In an embodiment, the cell 710 comprises power rails 731 and 732 and a plurality of signal lines $734_{1-5}$. The power rails 731 and 732 and the signal lines $734_{1-5}$ are coupled to the S/D contacts 726 and the gate contacts 725 by vias 727.

In an embodiment, a first signal line $734_1$ is connected to the "o1" S/D contact 726 in the n-type region 721. The first signal line $734_1$ extends back into the cell 710 (i.e., to the left in FIG. 7A) instead of extending to the right, as is the case in the example shown in FIG. 2B. Accordingly, the combinatorial cell 710 with a SCMP 7DG layout saves space compared to previous solutions.

In an embodiment, the additional connections of the combinatorial cell 710 may be similar to those in FIG. 2B, with the exception that the remaining signal lines are all advanced one row lower in the cell 710. For example, the signal line connecting the "n1" S/D contacts 726 in the n-type region 721 is second signal line $734_2$. A third signal line $734_{3-A}$ is connected to the "a" gate contact 725, and an additional third signal line $734_{3-B}$ is connected to the "c" gate contact 725. In an embodiment, a fourth signal line $734_4$ is connected to the "b" gate contact 725, and a fifth signal line $734_5$ is connected to the "o1" S/D contact 726 in the p-type region 722. In an embodiment, the first power rail 731 is connected to the "VCC" S/D contact 726, and the second power rail 732 is connected to the "VSS" S/D contacts 726.

Referring now to FIG. 7B, a plan view illustration of a transmission gate cell 710 with a SCMP 7DG layout is shown, in accordance with an embodiment. In an embodiment, the cell 710 comprises an n-type region 721 and a p-type region 722. In an embodiment, each gate contact 725 is within either the n-type region 721 or the p-type region 722. In an embodiment, the S/D contacts 726 may extend into both the p-type region 722 and the n-type region 721. In an embodiment, the cell 710 comprises power rails 731 and 732 and a plurality of signal lines $734_{1-5}$. The power rails 731 and 732 and the signal lines $734_{1-5}$ are coupled to the S/D contacts 726 and the gate contacts 725 by vias 727.

In an embodiment, a first signal line $734_1$ is connected to the "nC2" gate contact 725 in the n-type region 721. With the addition of an extra signal line row, there is no longer a need for dummy components, as is the case in the example shown in FIG. 3B. Accordingly, the combinatorial cell 710 with a SCMP 7DG layout saves space compared to previous solutions. That is, the combinatorial cell 710 may be implemented in 2 poly pitches. Furthermore, the elimination of dummy components also reduces the capacitance of the transmission gate cell 710.

In an embodiment, the additional connections of the combinatorial cell 710 may be similar to those in FIG. 3A, with the exception that the remaining signal lines are all advanced one row lower in the cell 710. For example, a second signal line $734_{2-A}$ is connected to the "nC1" gate contact 725 in the n-type region 721, and an additional second signal line $734_{2-B}$ is connected to the "n3" S/D contact 726 in the n-type region 721. In an embodiment, a third signal line $734_3$ is connected to the "n2" S/D contact 726, and a fourth signal line $734_4$ is connected to the "nC2" gate contact 725 in the p-type region 722. In an embodiment, a fifth signal line $734_{5-A}$ is connected to the "n1" S/D contact 726, and an additional fifth signal line $734_{5-B}$ is connected to the "nC1" gate contact 725 in the p-type regions 722.

Referring now to FIG. 7C, a plan view illustration of a four input NAND cell 710 with a SCMP 7DG layout is shown, in accordance with an embodiment. The cell 710 in FIG. 7C illustrates the power rails 731, 732 and the signal lines $734_{1-5}$. The dashed lines 745 indicate the metal tracks for the overlying metal layer (e.g., M1). Vias 727 provide connections from the illustrated metal layer (e.g., M0) to the underlying contacts (not shown in FIG. 7C).

As shown in FIG. 7C, each of the input signal lines (e.g., $734_2$, $734_{3-A}$, $734_{3-B}$, and $734_4$) include at least two hit-points 751, despite there being an occupied M1 trace 741 (with vias 747 to signal lines $734_1$ and $734_5$). Particularly, to make room for a pair of hit-points on signal line $734_{3-B}$, signal lines $734_{3-A}$, $734_4$, and $734_5$ are all moved down a row, compared to the example above in FIG. 4. Accordingly, the four input NAND cell 710 with a SCMP 7DG layout allows for there to be no hit-point errors in the layout.

FIGS. 7A-7C provide specific examples of how the SCMP 7DG cell layouts provide improvements in the routing compared to the previous examples described above. However, it is to be appreciated that these specific cell types are exemplary in nature, and that embodiments are not limited to any particular type of cell. Additionally, while described with respect to a 7DG cell height, it is to be appreciated that SCMP layouts may be used with any cell height library.

Figure 8A:
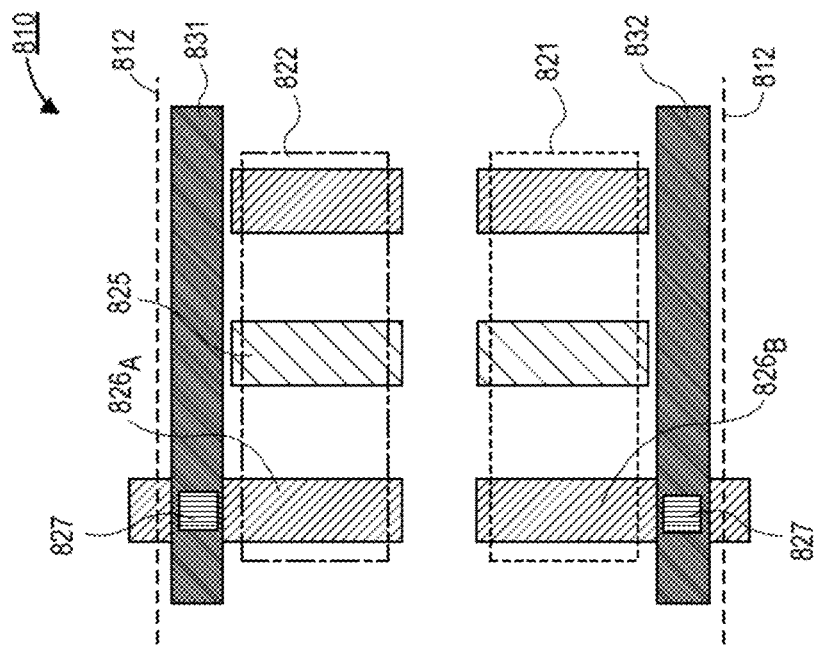
FIG. 8A is a plan view illustration of a cell that illustrates cell boundary errors that may occur when using a SCMP 7DG cell, in accordance with an embodiment.
Figure 8B:
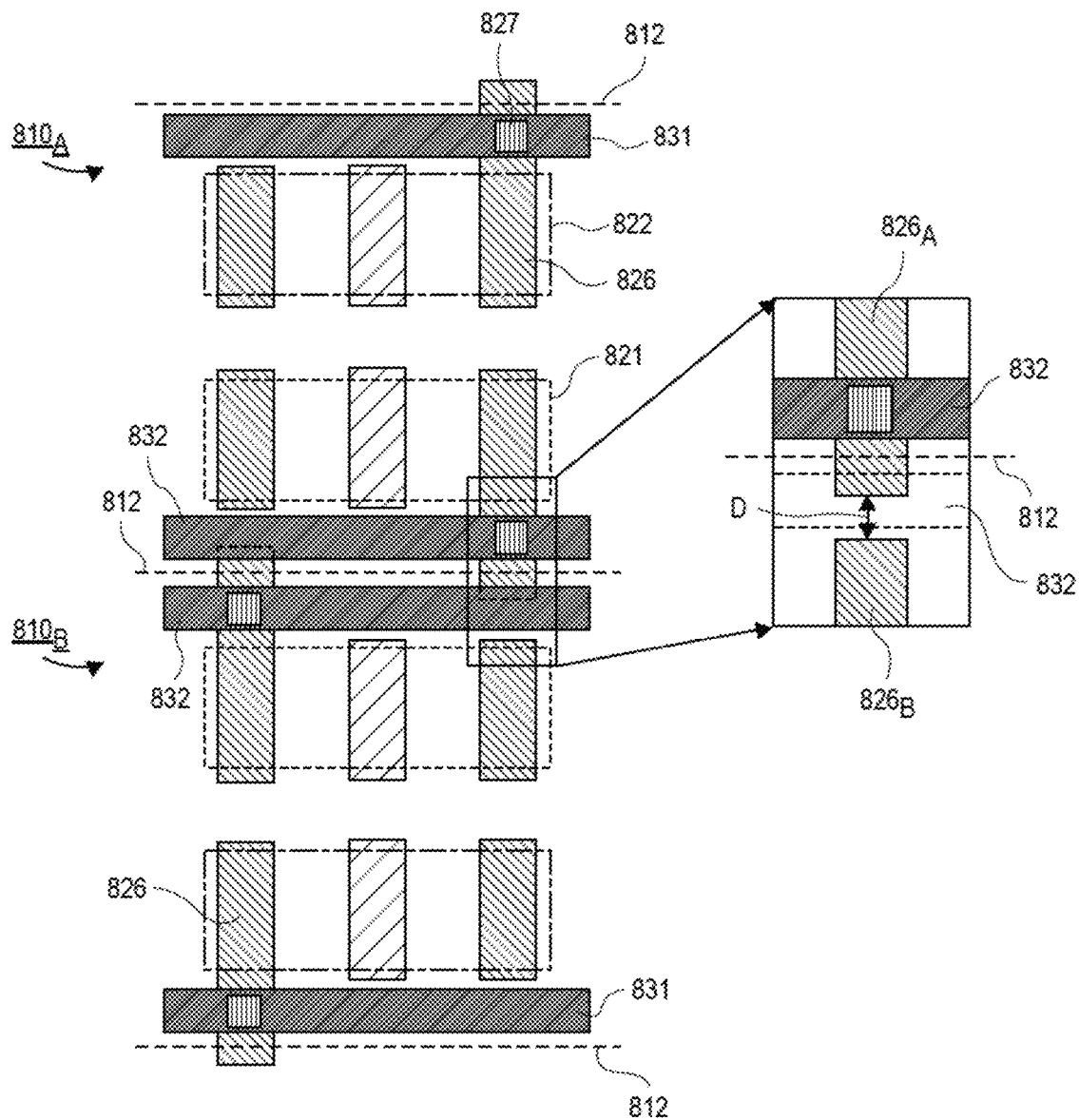
FIG. 8B is a plan view illustration of neighboring cells with cell boundary errors, in accordance with an embodiment.
Figure 8C:
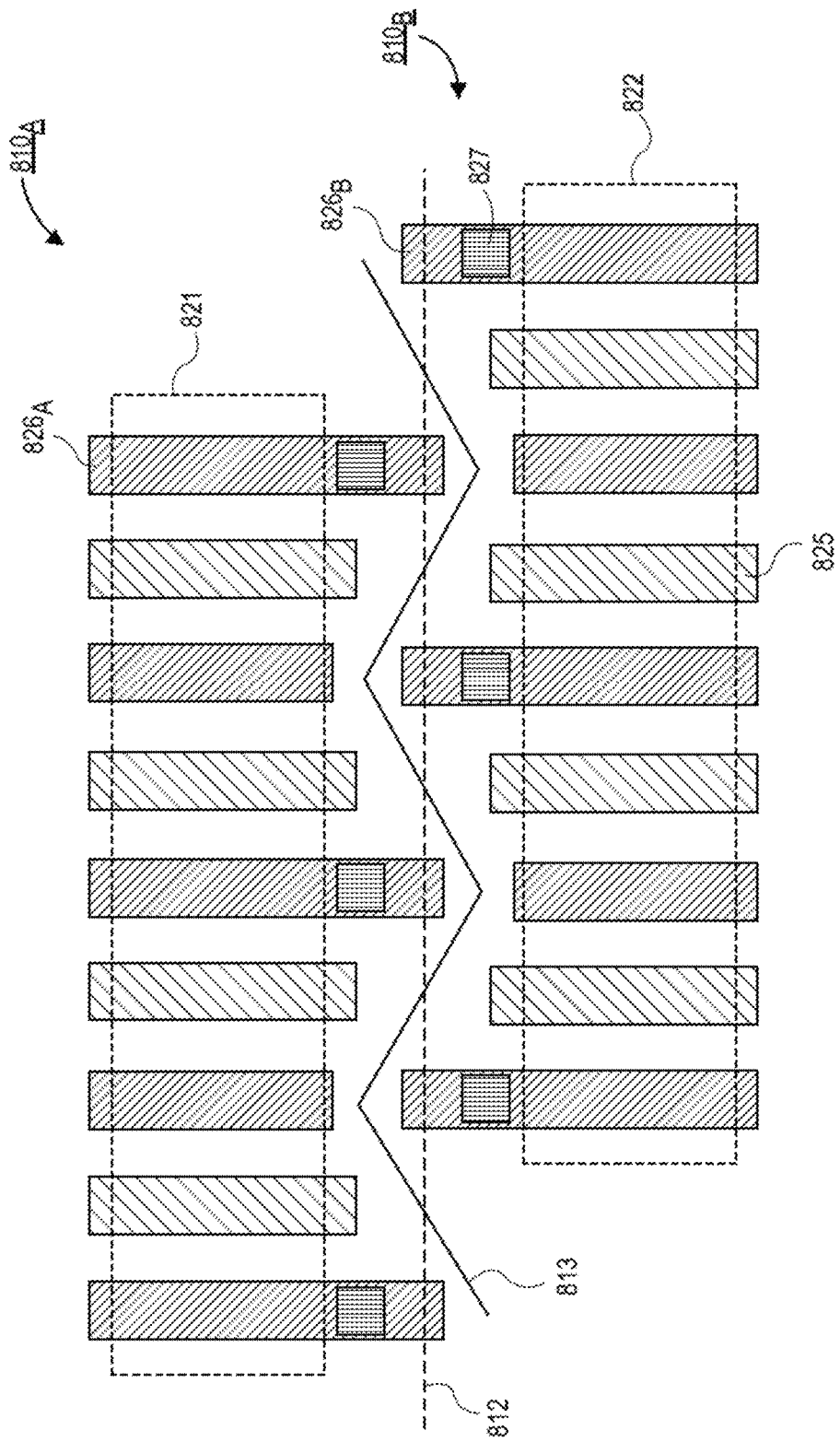
FIG. 8C is a plan view illustration of neighboring cells that are offset to accommodate cell boundary errors.

Referring now to FIGS. 8A-8C, a series of illustrations depict some structural variations that allow for proper via landing.

Referring now to FIG. 8A, a plan view illustration of a cell 810 is shown, in accordance with an embodiment. The cell comprises an n-type region 821 and a p-type region 822. The S/D contacts 826 and gate contacts 825 are shown in addition to the power rails 831 and 832. The signal lines are omitted in FIG. 8A for simplicity. As shown, when a via 827 is made from the power rails 831 or 832 to a contact (e.g., S/D contact 826 or gate contact 825), the contact may extend out beyond the cell boundary 812. The extension of the S/D contacts $826_A$ and $826_B$ allow for proper via landing tolerances.

Referring now to FIG. 8B, a plan view illustration of a pair of adjacent cells $810_A$ and $810_B$ are shown, in accordance with an embodiment. As shown, the edges of some of the S/D contacts 826 extend into the neighboring cell. A zoomed in illustration of one such region is provided. As shown, the edge of S/D contact $826_A$ extends past the cell boundary 812 and even under the neighboring power rail 832 (shown with dashed lines). This results in the edge-to-edge distance D between S/D contact $826_A$ and $826_B$ being reduced. In some embodiments, the design rules are relaxed in order to avoid edge-to-edge (ETE) design violations.

In other embodiments, ETE violations may be avoided by increasing the cut offsets. An example of such a configuration is provided in FIG. 8C. Even in the worst case scenarios shown in FIG. 8C, the first cell $810_A$ is offset from the second cell $810_B$ so that extensions past the cell boundary 812 are alternated between the two cells $810_A$ and $810_B$. In other words, in the case of a zig-zag pattern, the contact cuts are spaced apart enough from one another such that it will avoid any design rule complications.

Figure 9:
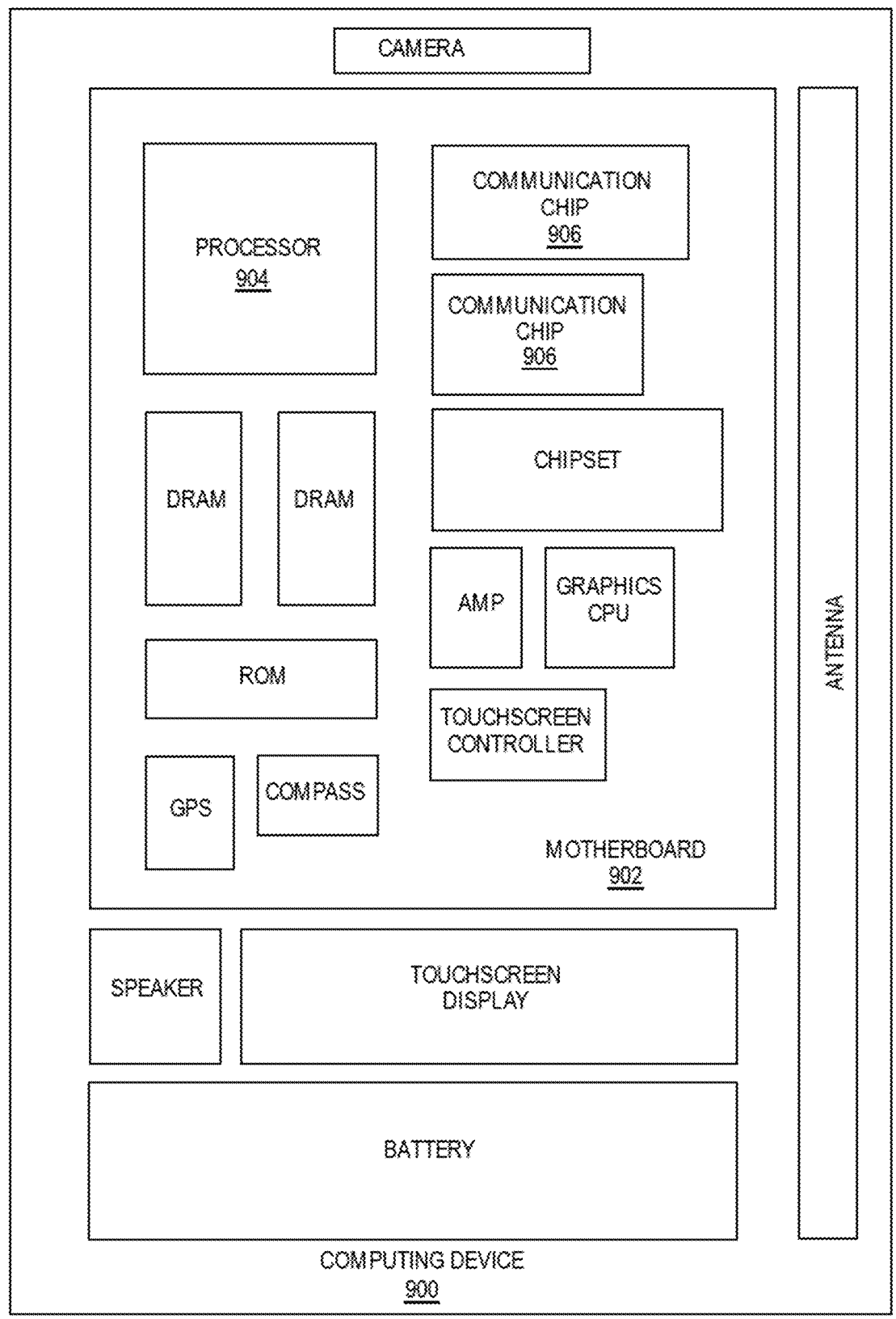
FIG. 9 illustrates a computing device in accordance with one implementation of an embodiment of the disclosure.

FIG. 9 illustrates a computing device 900 in accordance with one implementation of an embodiment of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In an embodiment, the integrated circuit die of the processor may comprise cells with a SCMP 7DG layout, as described herein. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In an embodiment, the integrated circuit die of the communication chip 906 may comprise interconnect layers that have cells with a SCMP 7DG layout, as described herein.

In further implementations, another component housed within the computing device 900 may comprise cells with a SCMP 7DG layout, as described herein.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
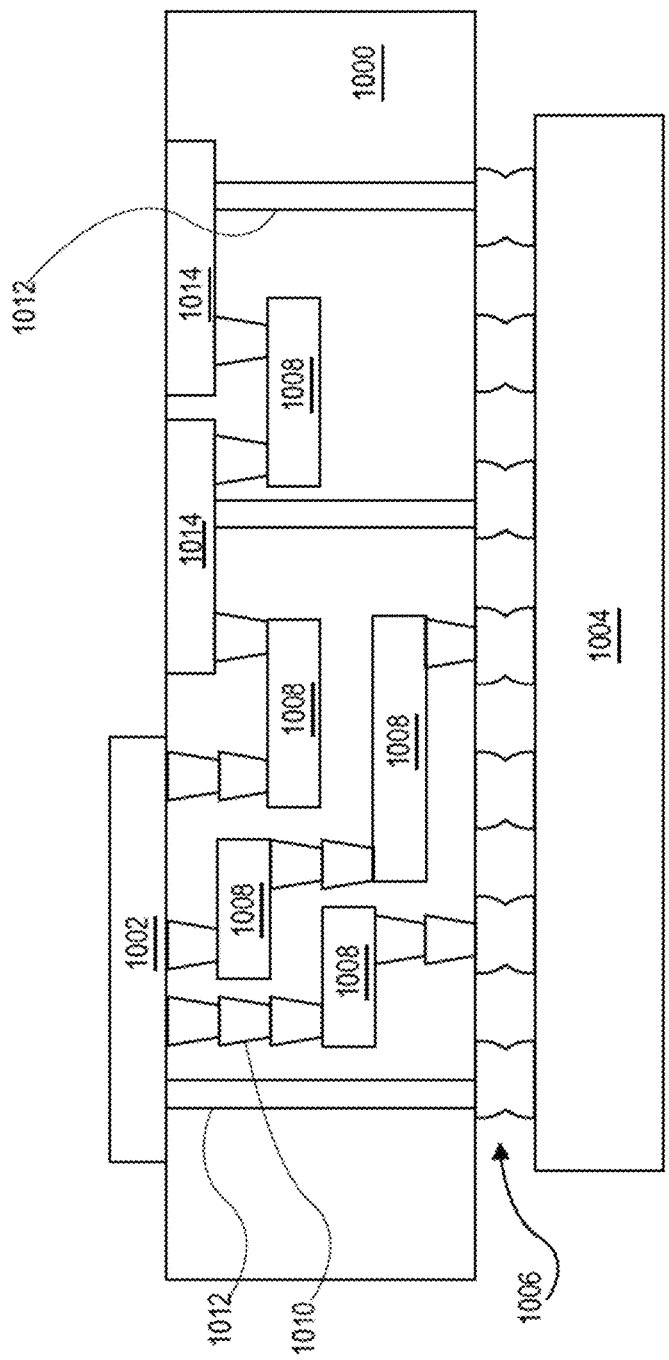
FIG. 10 is an interposer implementing one or more embodiments of the disclosure.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. In an embodiment, one of both of the first substrate 1002 and the second substrate 1004 may comprise cells with a SCMP 7DG layout, a second interference pattern, and a pattern recognition feature, or be fabricated using such an overlay target, in accordance with embodiments described herein. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the disclosure, apparatuses or processes disclosed herein may be used in the fabrication of interposer 1000.

Thus, embodiments of the present disclosure may comprise semiconductor devices with cells with a SCMP 7DG layout, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a cell on the substrate, wherein the cell comprises: a plurality of transistors over the substrate; and a first metal layer over the plurality of transistors, wherein the first metal layer comprises: a first power line, wherein a width of the first power line is entirely within the cell; a second power line, wherein a width of the second power line is entirely within the cell; and a plurality of signal lines between the first power line and the second power line.

Example 2: the semiconductor device of Example 1, wherein the first power line, the second power line, and the plurality of signal lines each have a uniform width.

Example 3: the semiconductor device of Example 2, wherein the width is less than approximately 20 nm.

Example 4: the semiconductor device of Examples 1-3, wherein the plurality of signal lines comprises five signal lines.

Example 5: the semiconductor device of Examples 1-4, wherein the plurality of transistors comprises an N-type transistor and a P-type transistor.

Example 6: the semiconductor device of Examples 1-5, wherein the first metal layer is electrically coupled to the plurality of transistors by vias.

Example 7: the semiconductor device of Examples 1-6, wherein the plurality of transistors comprise non-planar transistors.

Example 8: the semiconductor device of Example 7, wherein the non-planar transistors comprise fins.

Example 9: the semiconductor device of Example 8, wherein a length direction of the fins is parallel to a length direction of the plurality of signal lines.

Example 10: the semiconductor device of Examples 1-9, wherein the cell is a 7 diffusion grid (DG) cell.

Example 11: a semiconductor device, comprising: a substrate; a first cell on the substrate, wherein the first cell comprises: a first power line, wherein a width of the first power line is entirely within the first cell; a second power line, wherein a width of the second power line is entirely within the first cell; and a first plurality of signal lines between the first power line and the second power line; and a second cell on the substrate, wherein the second cell is adjacent to the first cell, and wherein the second cell comprises: a third power line, wherein a width of the third power line is entirely within the second cell, and wherein the third power line is adjacent to the second power line; a fourth power line, wherein a width of the fourth power line is entirely within the second cell; and a second plurality of signal lines between the third power line and the fourth power line.

Example 12: the semiconductor device of Example 11, wherein the first power line, the second power line, the third power line, the fourth power line, the first plurality of signal lines, and the second plurality of signal lines each have a uniform width.

Example 13: the semiconductor device of Example 12, wherein the width is less than approximately 20 nm.

Example 14: the semiconductor device of Examples 11-13, wherein the first plurality of signal lines comprises five signal lines, and wherein the second plurality of signal lines comprises five signal lines.

Example 15: the semiconductor device of Examples 11-14, wherein the first cell further comprises: a first transistor, wherein the first transistor comprises: a first source contact, a first drain contact, and a first gate contact, and wherein one or both of the first source contact and the first drain contact, extend into the second cell.

Example 16: the semiconductor device of Example 15 wherein the one or both of the first source contact and the first drain contact that extend into the second cell are electrically coupled to the second power line by a via.

Example 17: the semiconductor device of Example 15 or Example 16, wherein the second cell further comprises: a second transistor, wherein the second transistor comprises: a second source contact, a second drain contact, and a second gate contact, wherein one or both of the second source contact, the second drain contact extend into the first cell.

Example 18: the semiconductor device of Example 17, wherein the first cell is offset from the second cell.

Example 19: the semiconductor device of Example 17 or Example 18, wherein the first transistor and the second transistor are the same conductivity type.

Example 20: the semiconductor device of Examples 17-19, wherein the first transistor and the second transistor comprise a fin.

Example 21: the semiconductor device of Example 20, wherein a length direction of the fins is parallel to a length direction of the first plurality of signal lines and the second plurality of signal lines.

Example 22: an electronic system, comprising: a board; an electronic package coupled to the board; and a die coupled to the electronic package, wherein the die comprises: a plurality of cells, wherein each cell comprises: a plurality of transistors; and a first metal layer over the plurality of transistors, wherein the first metal layer comprises: a first power line, wherein a width of the first power line is entirely within the cell; a second power line, wherein a width of the second power line is entirely within the cell; and a plurality of signal lines between the first power line and the second power line.

Example 23: the electronic system of Example 22, wherein the first power line, the second power line, and the plurality of signal lines each have a uniform width.

Example 24: the electronic system of Example 22 or Example 23, wherein the plurality of signal lines in one or more of the plurality of cells comprises five signal lines.

Example 25: the electronic system of Example 24, wherein one or more of the plurality of cells is a 7 diffusion grid (DG) cell.

What is claimed is:

1. A semiconductor device, comprising:
    a substrate;
    a cell on the substrate, wherein the cell comprises:
        a plurality of transistors over the substrate; and
        a first metal layer over the plurality of transistors, wherein the first metal layer comprises:
            a first power line, wherein a width of the first power line is entirely within the cell;
            a second power line, wherein a width of the second power line is entirely within the cell; and
            a plurality of signal lines between the first power line and the second power line.

2. The semiconductor device of claim 1, wherein the first power line, the second power line, and the plurality of signal lines each have a uniform width.

3. The semiconductor device of claim 2, wherein the width is less than approximately 20 nm.

4. The semiconductor device of claim 1, wherein the plurality of signal lines comprises five signal lines.

5. The semiconductor device of claim 1, wherein the plurality of transistors comprises an N-type transistor and a P-type transistor.

6. The semiconductor device of claim 1, wherein the first metal layer is electrically coupled to the plurality of transistors by vias.

7. The semiconductor device of claim 1, wherein the plurality of transistors comprise non-planar transistors.

8. The semiconductor device of claim 7, wherein the non-planar transistors comprise fins.

9. The semiconductor device of claim 8, wherein a length direction of the fins is parallel to a length direction of the plurality of signal lines.

10. The semiconductor device of claim 1, wherein the cell is a 7 diffusion grid (DG) cell.

11. A semiconductor device, comprising:
    a substrate;
    a first cell on the substrate, wherein the first cell comprises:
        a first power line, wherein a width of the first power line is entirely within the first cell;
        a second power line, wherein a width of the second power line is entirely within the first cell, wherein the first power line and the second power line are outermost lines of the first cell; and
        a first plurality of signal lines between the first power line and the second power line; and
    a second cell on the substrate, wherein the second cell is adjacent to the first cell, and wherein the second cell comprises:
        a third power line, wherein a width of the third power line is entirely within the second cell, and wherein the third power line is adjacent to the second power line;
        a fourth power line, wherein a width of the fourth power line is entirely within the second cell, wherein the third power line and the fourth power line are outermost lines of the second cell; and
        a second plurality of signal lines between the third power line and the fourth power line.

12. The semiconductor device of claim 11, wherein the first power line, the second power line, the third power line, the fourth power line, the first plurality of signal lines, and the second plurality of signal lines each have a uniform width.

13. The semiconductor device of claim 12, wherein the width is less than approximately 20 nm.

14. The semiconductor device of claim 11, wherein the first plurality of signal lines comprises five signal lines, and wherein the second plurality of signal lines comprises five signal lines.

15. The semiconductor device of claim 11, wherein the first cell further comprises:
    a first transistor, wherein the first transistor comprises:
        a first source contact, a first drain contact, and a first gate contact, and wherein one or both of the first source contact and the first drain contact, extend into the second cell.

16. The semiconductor device of claim 15 wherein the one or both of the first source contact and the first drain contact that extend into the second cell are electrically coupled to the second power line by a via.

17. The semiconductor device of claim 15, wherein the second cell further comprises:
    a second transistor, wherein the second transistor comprises:
        a second source contact, a second drain contact, and a second gate contact, wherein one or both of the second source contact, the second drain contact extend into the first cell.

18. The semiconductor device of claim 17, wherein the first cell is offset from the second cell.

19. The semiconductor device of claim 17, wherein the first transistor and the second transistor are the same conductivity type.

20. The semiconductor device of claim 17, wherein the first transistor and the second transistor comprise a fin.

21. The semiconductor device of claim 20, wherein a length direction of the fins is parallel to a length direction of the first plurality of signal lines and the second plurality of signal lines.

22. An electronic system, comprising:
    a board;
    an electronic package coupled to the board; and
    a die coupled to the electronic package, wherein the die comprises:
        a plurality of cells, wherein each cell comprises:
            a plurality of transistors; and
            a first metal layer over the plurality of transistors, wherein the first metal layer comprises:
                a first power line, wherein a width of the first power line is entirely within the cell;
                a second power line, wherein a width of the second power line is entirely within the cell; and
                a plurality of signal lines between the first power line and the second power line.

23. The electronic system of claim 22, wherein the first power line, the second power line, and the plurality of signal lines each have a uniform width.

24. The electronic system of claim 22, wherein the plurality of signal lines in one or more of the plurality of cells comprises five signal lines.

25. The electronic system of claim 24, wherein one or more of the plurality of cells is a 7 diffusion grid (DG) cell.

* * * * *